(12) United States Patent (10) Patent No.: US 12,700,577 B2
Amano et al. (45) Date of Patent: Aug. 4, 2026

(54) CERAMIC SUSCEPTOR

(71) Applicant: NGK INSULATORS, LTD., Nagoya (JP)

(72) Inventors: Shingo Amano, Chita (JP); Reon Takanoya, Handa (JP); Yuya Matsuo, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 202 days.

(21) Appl. No.: 18/638,932

(22) Filed: Apr. 18, 2024

(65) Prior Publication Data

US 2025/0125128 A1    Apr. 17, 2025

Related U.S. Application Data

(63) Continuation of application No. PCT/JP2023/036885, filed on Oct. 11, 2023.

(51) Int. Cl.
*H01J 37/32* (2006.01)
*C23C 16/458* (2006.01)
(Continued)

(52) U.S. Cl.
CPC .... *H01J 37/32834* (2013.01); *C23C 16/4583* (2013.01); *H01J 37/32724* (2013.01);
(Continued)

(58) Field of Classification Search
CPC ........... H01J 37/32834; H01J 37/32724; H01J 2237/2007; H01J 2237/3321;
(Continued)

(56) References Cited

U.S. PATENT DOCUMENTS 6,464,790 B1* 10/2002 Sherstinsky ...... C23C 16/45521
269/21
2016/0002778 A1* 1/2016 Ravi ..................... C23C 16/455
118/728
(Continued)

FOREIGN PATENT DOCUMENTS

JP      2009-064917 A      3/2009
JP      2012-080103 A      4/2012
(Continued)

OTHER PUBLICATIONS

English translation of the International Search Report dated Dec. 19, 2022 (Application No. PCT/JP2023/036885).
(Continued)

*Primary Examiner* — Sreeya Sreevatsa
(74) *Attorney, Agent, or Firm* — Muncy, Geissler, Olds & Lowe, P.C.

(57) ABSTRACT

There is provided a ceramic susceptor including a disk-shaped ceramic plate bonded body including an upper ceramic plate and a lower ceramic plate, an internal electrode embedded in the bonded body, and a purge gas groove, a vacuum suction groove, and a thermocouple insertion groove that are respectively provided on a bonding surface side of the upper ceramic plate or the lower ceramic plate. The ceramic plate bonded body has a central zone and an outer peripheral zone. The purge gas groove, the vacuum suction groove, and the thermocouple insertion groove respectively have straight-line portions in the central zone. An angle $\theta_1$ formed by a straight-line portion of the purge gas groove and a straight-line portion of the thermocouple insertion groove, and an angle $\theta_2$ formed by the straight-line portion of the purge gas groove and a straight-line portion of the vacuum suction groove satisfy $90° < \theta_1 < 180°$, $135° < \theta_2 < 225°$, and $\theta_1 < \theta_2$.

13 Claims, 6 Drawing Sheets

(51) Int. Cl.
   *H10P 72/72*       (2026.01)
   *H10P 72/78*       (2026.01)

(52) U.S. Cl.
   CPC ............ *H10P 72/722* (2026.01); *H10P 72/78*
         (2026.01); *H01J 2237/2007* (2013.01); *H01J*
         *2237/3321* (2013.01)

(58) Field of Classification Search
   CPC ............ C23C 16/4583; H01L 21/6833; H01L
         21/6838; H01L 21/67103; H01L
         21/67109; H01L 21/67248; H01L
         21/68785
   USPC ......................................................... 361/234
   See application file for complete search history.

(56) References Cited

U.S. PATENT DOCUMENTS

| | | | | |
|---|---|---|---|---|
| 2021/0212172 A1* | 7/2021 | Takahashi | .............. | H05B 3/143 |
| 2022/0262657 A1* | 8/2022 | Mahakali | ............ | C23C 16/4586 |

FOREIGN PATENT DOCUMENTS

| | | |
|---|---|---|
| JP | 2017-527984 A | 9/2017 |
| JP | 2022-147715 A | 10/2022 |
| WO | 2020/129754 A1 | 6/2020 |
| WO | 2023/166866 A1 | 9/2023 |

OTHER PUBLICATIONS

International Search Report and Written Opinion dated Dec. 19, 2023 (Application No. PCT/JP2023/036885).

\* cited by examiner

CERAMIC SUSCEPTOR

CROSS-REFERENCE TO RELATED APPLICATION

This application is a continuation application of PCT/JP2023/036885 filed Oct. 11, 2023, the entire contents of which are incorporated herein by reference.

BACKGROUND OF THE INVENTION

1. Field of the Invention

The present disclosure relates to a ceramic susceptor.

2. Description of the Related Art

Susceptors are used to support wafers in film forming apparatuses and etching apparatuses for semiconductor manufacturing processes. As such susceptors, susceptors including ceramic plates for allowing wafers to be placed thereon, and cylindrical ceramic shafts attached to the ceramic plates are widely used. Ceramic plates generally have a structure in which internal electrodes such as heater electrodes, RF electrodes, and electrostatic chuck (ESC) electrodes are embedded inside ceramic substrates made of aluminum nitride (AlN) that has excellent heat resistance and corrosion resistance.

Some known ceramic plates have internal paths such as a purge gas flow path for ejecting purge gas from an outer periphery or a top surface of the ceramic plate, a vacuum suction path for making vacuum suction possible on the ceramic plate top surface, and a thermocouple insertion path for allowing a thermocouple for measuring temperature of the ceramic plate to be accommodated.

Patent Literature 1 (JP2017-527984A) discloses a substrate support including the first plate having a plurality of purge gas channels on the back side, a second plate disposed directly under the first plate, and an edge ring surrounding the first plate. In this substrate support, a plurality of purge gas channels extend from a single inlet in a center portion of the first plate to a plurality of outlets in a peripheral portion, and the plurality of purge gas channels have substantially equal conductance. The Literature also discloses that the first plate further includes one or a plurality of vacuum grooves or the like disposed on the back side.

Patent Literature 2 (JP2012-80103A) discloses a susceptor including a disk-shaped ceramic plate, a thermocouple accommodation space formed inside the ceramic plate, and a thermocouple that is accommodated in the thermocouple accommodation space. The ceramic plate is formed from a pair of ceramic disks bonded together, and the thermocouple accommodation space is formed from a horizontal groove formed in a bonding surface or bonding surfaces of one or both of the pair of ceramic disks.

CITATION LIST

Patent Literature

Patent Literature 1: JP2017-527984A
Patent Literature 2: JP2012-80103A

SUMMARY OF THE INVENTION

When the ceramic plate is to be provided with a plurality of types of internal paths such as a purge gas flow path (for example, the purge gas channel as described above), a vacuum suction path (for example, the vacuum groove as described above), and a thermocouple insertion path (for example, the thermocouple accommodation space or a horizontal groove as described above), it is required that the different types of internal paths do not intersect in order to secure the functions of the internal paths. For this reason, one possible idea is to arrange these internal paths separately in a first bonding surface and a second bonding surface of the ceramic plate of a three-layer configuration to allow the internal paths to have a two-layer configuration. However, this approach leads to an increase in manufacturing cost. Therefore, it would be advantageous if a plurality of types of internal paths could be provided in a single-layer configuration along one bonding surface of the ceramic plate having a two-layer configuration. However, each of the purge gas flow path, the vacuum suction path, and thermocouple insertion path has its own peculiar positional constraints and requirements, and it is not easy to realize them with a single-layer configuration.

The present inventors have now found that by providing the purge gas groove, the vacuum suction groove, and the thermocouple insertion groove to respectively have straight-line portions, and allowing an angle $\theta_1$, which is formed by the straight-line portion of the purge gas groove and the straight-line portion of the thermocouple insertion groove, and an angle $\theta_2$, which is formed by the straight-line portion of the purge gas groove and the straight-line portion of the vacuum suction groove, to satisfy predetermined relationship, it is possible to provide a ceramic susceptor including the purge gas flow path, the vacuum suction path, and the thermocouple insertion path inside so that they are contained in one layer without impairing the respective functions.

Accordingly, an object of the present invention is to provide a ceramic susceptor including a purge gas flow path, a vacuum suction path, and a thermocouple insertion path inside so that they are contained in one layer without impairing respective functions.

The present invention provides the following aspects.

[Aspect 1]

A ceramic susceptor, comprising:

a disk-shaped ceramic plate bonded body comprising an upper ceramic plate and a lower ceramic plate that are bonded to each other on a bonding surface, the ceramic plate bonded body having a first surface of the upper ceramic plate on an opposite side to the bonding surface and a second surface of the lower ceramic plate on an opposite side to the bonding surface;

at least one internal electrode selected from the group consisting of a heater electrode, an RF electrode, and an ESC electrode, and embedded in the ceramic plate bonded body;

a purge gas groove provided on a bonding surface side of the upper ceramic plate or the lower ceramic plate, and constituting a purge gas flow path with the bonding surface;

a vacuum suction groove provided on the bonding surface side of the upper ceramic plate or the lower ceramic plate without intersecting the purge gas groove, and constituting a vacuum suction path with the bonding surface; and a thermocouple insertion groove provided on the bonding surface side of the upper ceramic plate or the lower ceramic plate without intersecting the purge gas flow path and the vacuum suction path, and constituting a thermocouple insertion path with the bonding surface, wherein when seen in plan view, the ceramic plate bonded body has a central zone defined as a circular region in which a ceramic shaft is to be concentrically disposed, and an outer peripheral zone outside the central zone, wherein the purge gas groove has a straight-line portion arranged in a straight line toward the outer peripheral zone from a purge gas inlet in the central zone, and an extended portion that extends in the outer peripheral zone from the straight-line portion to reach a plurality of purge gas outlets disposed in an outer peripheral portion of the ceramic plate bonded body through one or more selected from the group consisting of branching, bending, curving, and straight progression, wherein the vacuum suction groove has a straight-line portion arranged in a straight line toward the outer peripheral zone from a vacuum suction inlet in the central zone, and an extended portion that extends in the outer peripheral zone from the straight-line portion to reach a plurality of vacuum suction outlets of the ceramic plate bonded body through one or more selected from the group consisting of branching, bending, curving, and straight progression, wherein the thermocouple insertion groove has a straight-line portion that is arranged in a straight line toward a thermocouple insertion path end located in the outer peripheral zone from a thermocouple insertion port in the central zone, and wherein an angle $\theta_1$ formed by the straight-line portion of the purge gas groove and the straight-line portion of the thermocouple insertion groove, and an angle $\theta_2$ formed by the straight-line portion of the purge gas groove and the straight-line portion of the vacuum suction groove satisfy the following relationship:

$$50° < \theta_1 < 180°,$$

$$135° < \theta_2 < 310°, \text{ and}$$

$$\theta_1 < \theta_2.$$

[Aspect 2]

The ceramic susceptor according to aspect 1, further comprising a cylindrical ceramic shaft concentrically attached to the central zone in the second surface of the ceramic plate bonded body.

[Aspect 3]

The ceramic susceptor according to aspect 1 or 2, wherein each of path lengths of the purge gas groove from the purge gas inlet to the plurality of purge gas outlets is within ±10% of an average path length of the purge gas groove.

[Aspect 4]

The ceramic susceptor according to any one of aspects 1 to 3, wherein each of path lengths of the vacuum suction groove from the vacuum suction inlet to the plurality of the vacuum suction outlets is within ±10% of an average path length of the vacuum suction groove.

[Aspect 5]

The ceramic susceptor according to any one of aspects 2 to 4, comprising a purge gas supply hole that penetrates through a side wall constituting the ceramic shaft and the lower ceramic plate to communicate with the purge gas inlet, whereby the purge gas supply hole, the purge gas inlet, the purge gas groove, and the purge gas outlets entirely constitute the purge gas flow path.

[Aspect 6]

The ceramic susceptor according to any one of aspects 1 to 5, wherein the plurality of purge gas outlets are disposed at equal intervals along the outer peripheral portion of the ceramic plate bonded body.

[Aspect 7]

The ceramic susceptor according to any one of aspects 1 to 6, further comprising a purge ring annularly provided along an outer peripheral edge of the ceramic plate bonded body to guide purge gas discharged from the purge gas outlets so that the purge gas is ejected from an outer peripheral portion of the first surface, wherein a gap between the outer peripheral edge of the ceramic plate bonded body and the purge ring constitutes a purge gas ejection port.

[Aspect 8]

The ceramic susceptor according to any one of aspects 1 to 7, wherein the upper ceramic plate further includes a vertical hole communicating with the first surface from the purge gas outlet, and the vertical hole constitutes a purge gas ejection port that allows purge gas to be ejected from an outer peripheral portion of the first surface.

[Aspect 9]

The ceramic susceptor according to any one of aspects 2 to 8, comprising a vacuum suction hole that penetrates through a side wall constituting the ceramic shaft and the lower ceramic plate to communicate with the vacuum suction inlet, whereby the vacuum suction hole, the vacuum suction inlet, the vacuum suction groove, and the vacuum suction outlets entirely constitute the vacuum suction path.

[Aspect 10]

The ceramic susceptor according to any one of aspects 1 to 9, wherein the plurality of vacuum suction outlets are disposed rotationally symmetrically with respect to a center axis of the ceramic plate bonded body.

[Aspect 11]

The ceramic susceptor according to any one of aspects 1 to 10, further comprising a tubular thermocouple guide that is provided in the second surface of the ceramic plate bonded body to communicate with the thermocouple insertion port in an internal space of the ceramic shaft to guide insertion of a thermocouple into the thermocouple insertion path.

[Aspect 12]

The ceramic susceptor according to aspect 11, further comprising a thermocouple inserted into the thermocouple insertion path through the thermocouple guide and the thermocouple insertion port.

[Aspect 13]

The ceramic susceptor according to any one of aspects 1 to 12, wherein when each of the grooves of the purge gas groove, the vacuum suction groove, and the thermocouple insertion groove is seen in a section perpendicular to a longitudinal direction of the groove, a height of a central portion of the groove is from 0.1 to 3.0 mm, a height of an end portion of the groove is from 0.5 to 3.0 mm, a width of the groove is from 2.0 to 10.0 mm, and a ratio of the height of the end portion of the groove to the height of the central portion of the groove is from 0.2 to 1.0.

DETAILED DESCRIPTION OF THE INVENTION

A ceramic susceptor according to the present invention is a stand made of ceramic to support a wafer, which is used in a film forming apparatus or an etching apparatus, in particular, a film forming apparatus or an etching apparatus for a semiconductor manufacturing process. For example, the ceramic susceptor according to the present invention may be a ceramic heater for a semiconductor film forming apparatus, or an electrostatic chuck for a semiconductor etching apparatus. Alternatively, it may be an electrostatic chuck heater including both a heater function and an electrostatic chuck function. Typical examples of the film forming apparatus include a CVD (chemical vapor deposition) apparatus (for example, a thermal CVD apparatus, a plasma CVD apparatus, an optical CVD apparatus, and a MOCVD apparatus) and a PVD (physical vapor deposition) apparatus.

Figure 1:
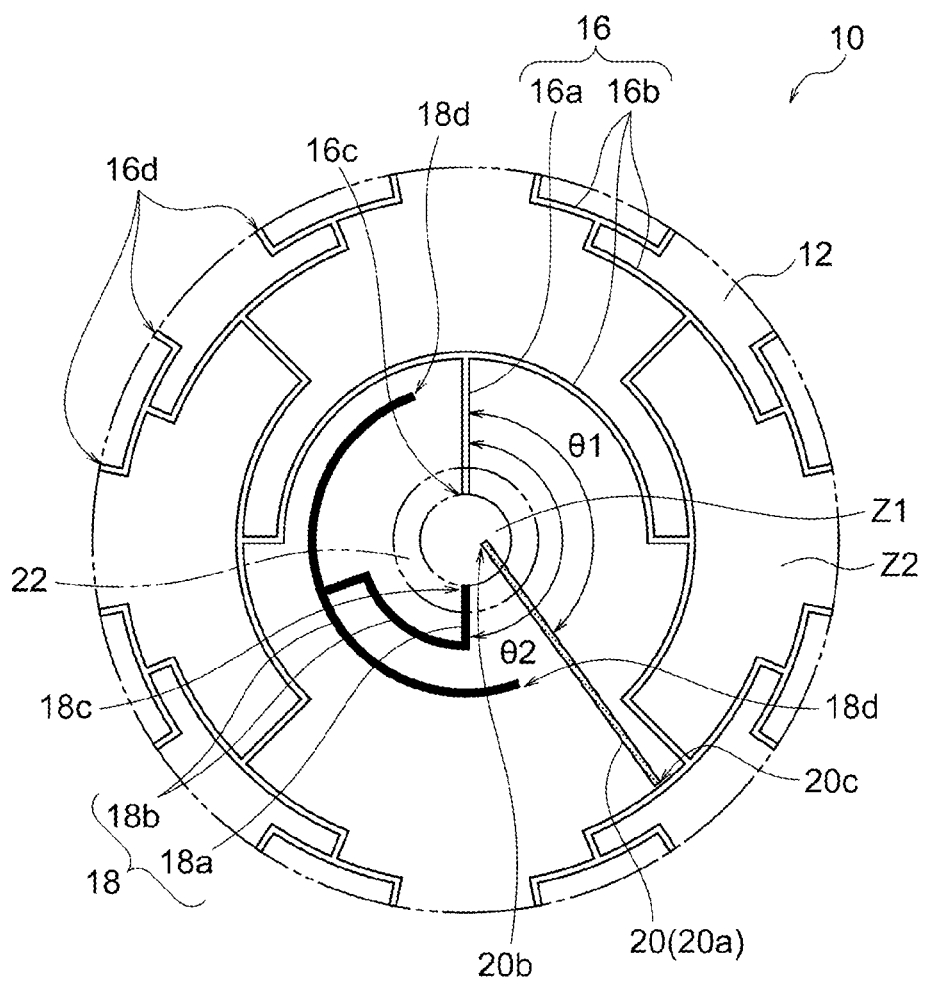
FIG. 1 is a perspective plan view showing arrangement of a purge gas groove, a vacuum suction groove, and a thermocouple insertion groove in a ceramic susceptor according to the present invention.
Figure 2:
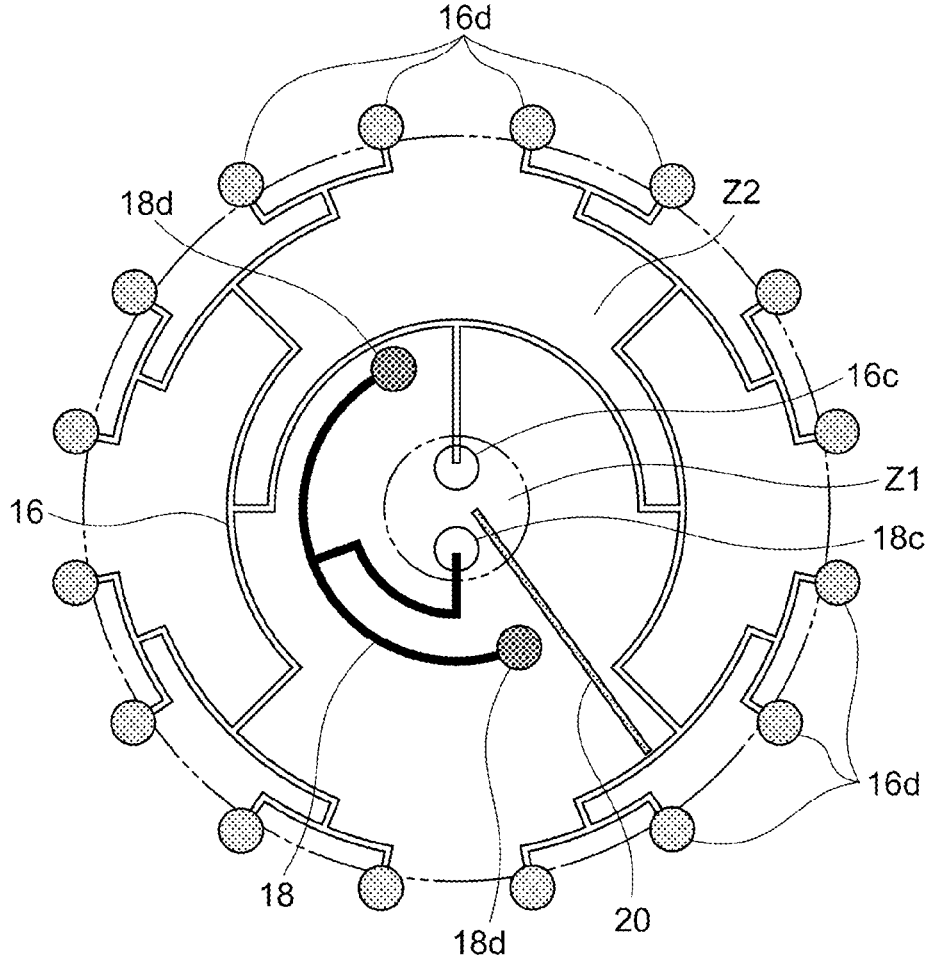
FIG. 2 is a conceptual view for describing arrangement of a purge gas inlet, purge gas outlets, a vacuum suction inlet, and vacuum suction outlets in FIG. 1, and for ease of understanding, these inlets and outlets are drawn exaggeratedly with open circles and filled circles, respectively. Accordingly, large circles representing the purge gas inlet 16c, the purge gas outlets 16d, the vacuum suction inlet 18c, and the vacuum suction outlets 18d only show positions of them by emphasizing the positions, and do not represent shapes and sizes of them.
Figure 3:
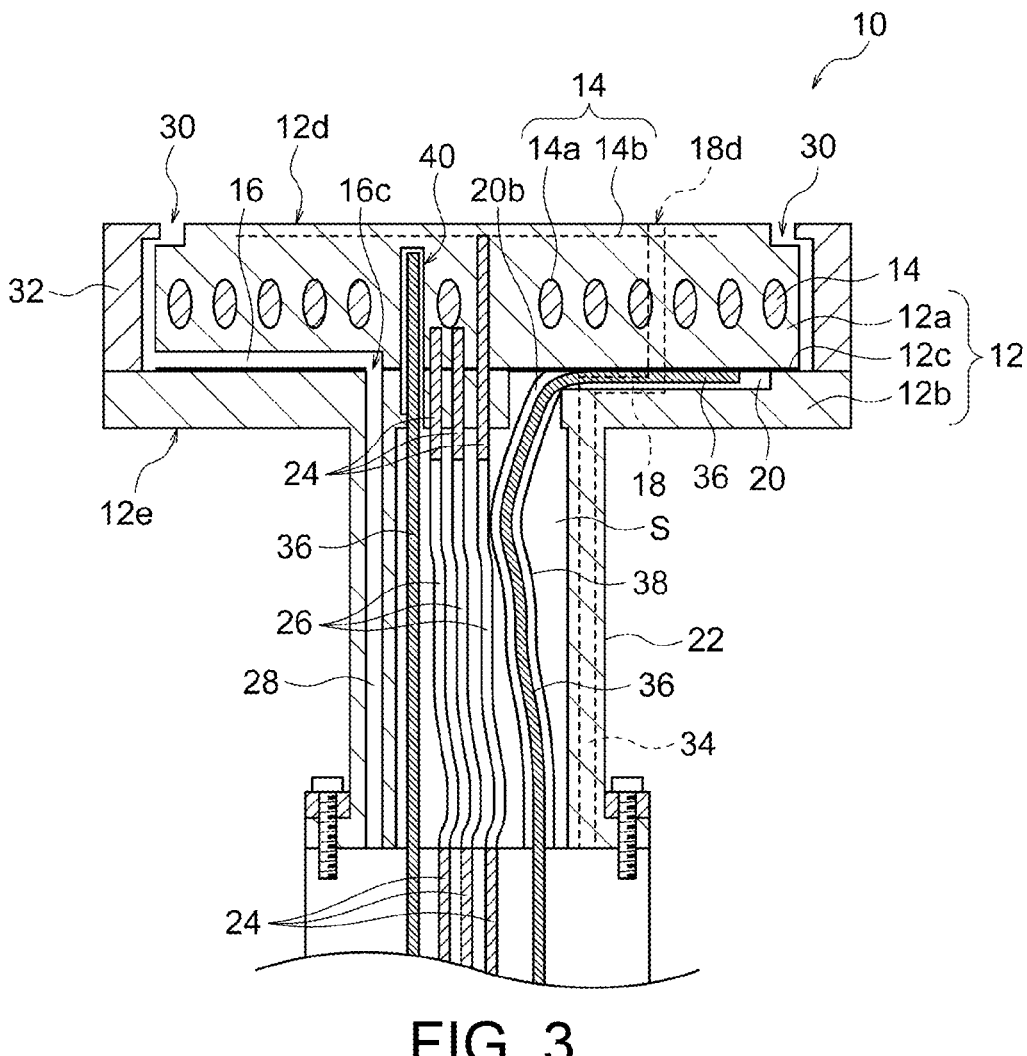
FIG. 3 is a schematic sectional view of a ceramic susceptor shown in FIGS. 1 and 2.

FIGS. 1 to 3 show an example of the ceramic susceptor. A ceramic susceptor 10 shown in FIGS. 1 to 3 includes a ceramic plate bonded body 12, an internal electrode 14, a purge gas groove 16, a vacuum suction groove 18, and a thermocouple insertion groove 20. The ceramic plate bonded body 12 is disk-shaped, and includes an upper ceramic plate 12a and a lower ceramic plate 12b that are bonded to each other on a bonding surface 12c. The ceramic plate bonded body 12 has a first surface 12d of the upper ceramic plate 12a on an opposite side to the bonding surface 12c and a second surface 12e of the lower ceramic plate 12b on an opposite side to the bonding surface 12c. The internal electrode 14 is at least one selected from the group consisting of a heater electrode, an RF electrode, and an ESC electrode, and is embedded in the ceramic plate bonded body 12. The purge gas groove 16 is a groove forming a purge gas flow path with the bonding surface 12c and is provided on a bonding surface 12c side of the upper ceramic plate 12a or the lower ceramic plate 12b. The vacuum suction groove 18 is a groove forming a vacuum suction path with the bonding surface 12c, and is provided on the bonding surface 12c side of the upper ceramic plate 12a or the lower ceramic plate 12b without intersecting the purge gas groove 16. The thermocouple insertion groove 20 is a groove forming a thermocouple insertion path with the bonding surface 12c and provided on the bonding surface 12c side of the upper ceramic plate 12a or the lower ceramic plate 12b without intersecting the purge gas flow path and the vacuum suction path. The ceramic plate bonded body 12 has a central zone Z1 and an outer peripheral zone Z2. The central zone Z1 is defined as a circular region in which a ceramic shaft 22 is to be concentrically disposed, and the outer peripheral zone Z2 is a region outside the central zone Z1, when seen in plan view. The purge gas groove 16 has a straight-line portion 16a and an extended portion 16b. The straight-line portion 16a of the purge gas groove 16 is arranged in a straight line toward the outer peripheral zone Z2 from the purge gas inlet 16c in the central zone Z1. The extended portion 16b of the purge gas groove 16 extends in the outer peripheral zone from the straight-line portion 16a to reach the plurality of purge gas outlets 16d disposed in an outer peripheral portion of the ceramic plate bonded body 12 through one or more selected from the group consisting of branching, bending, curving, and straight progression. The vacuum suction groove 18 also has a straight-line portion 18a and an extended portion 18b. The straight-line portion 18a of the vacuum suction groove 18 is arranged in a straight line toward the outer peripheral zone Z2 from the vacuum suction inlet 18c in the central zone Z1. The extended portion 18b of the vacuum suction groove 18 extends in the outer peripheral zone Z2 from the straight-line portion 18a to reach the plurality of vacuum suction outlets 18d of the ceramic plate bonded body 12 through one or more selected from the group consisting of branching, bending, curving, and straight progression. The thermocouple insertion groove 20 has a straight-line portion 20a, and the straight-line portion 20a is arranged in a straight line toward a thermocouple insertion path end 20c located in the outer peripheral zone Z2 from a thermocouple insertion port 20b in the central zone Z1. In the configuration like this, an angle $\theta_1$ formed by the straight-line portion 16a of the purge gas groove 16 and the straight-line portion 20a of the thermocouple insertion groove 20, and an angle $\theta_2$ formed by the straight-line portion 16a of the purge gas groove 16 and the straight-line portion 18a of the vacuum suction groove 18 satisfy the following relationship:

$$50° < \theta_1 < 180°,$$

$$135° < \theta_2 < 310°, \text{ and}$$

$$\theta_1 < \theta_2.$$

With the relationship being satisfied, it is possible to provide the ceramic susceptor 10 including the purge gas flow path, the vacuum suction path, and the thermocouple insertion path inside so that they are contained in one layer without impairing respective functions.

As described above, when the ceramic plate is to be provided with a plurality of types of internal paths such as a purge gas flow path, a vacuum suction path, and a thermocouple insertion path, it is required that the different types of internal paths do not intersect in order to secure the functions of the respective internal paths. For this reason, one possible idea is to cause these internal paths to have a two-layer configuration, but this approach leads to an increase in manufacturing cost. Therefore, it would be advantageous if a plurality of types of internal paths could be provided in a single-layer configuration along one bonding surface of the ceramic plate of a two-layer configuration. In the present description, "providing a plurality of types of internal paths in a single-layer configuration along one bonding surface" means providing the plurality of types of internal paths in any form of an upper internal path with the bonding surface as a bottom part, a lower internal path with the bonding surface as a top part, and a combination of them (that is, a composite internal path including the position that is the bonding surface). However, each of the purge gas flow path, the vacuum suction path, and the thermocouple insertion path has its own peculiar positional constraints and requirements, and it is not easy to realize them in a single-layer configuration. For example, the internal paths tend to be crowded at a bonding portion between the ceramic plate and the ceramic shaft, and in that case, there is a risk that the crowded spot becomes weak and the ceramic plate breaks due to bonding with the ceramic shaft. Further, the purge gas groove is desired to have many purge gas outlets in the outer periphery of the ceramic plate, and unless the path lengths to the respective purge gas outlets are made as uniform as possible, uniformness of the process using the ceramic susceptor cannot be maintained. Further, the vacuum suction groove is desired to have the vacuum suction outlets in at least two spots, and unless the path lengths to the respective vacuum suction outlets are made as uniform as possible, wafers cannot be sucked uniformly. In addition, the thermo-couple insertion groove needs to have a fixed length to measure a temperature of the internal electrode in the ceramic plate outer peripheral portion. With such various constraints and requirements, the ceramic susceptor 10 of the present invention can include the purge gas flow path, the vacuum suction path, and the thermocouple insertion path inside so that they are contained in one layer without impairing the respective functions. With Use of the ceramic susceptor 10 like this in the film forming process, it is possible to cause the respective functions of the purge gas flow path, the vacuum suction path, and the thermocouple insertion path to be exhibited as much as possible, realize a stable suction force and a uniform temperature, and improve film formability as a result.

Figure 4:
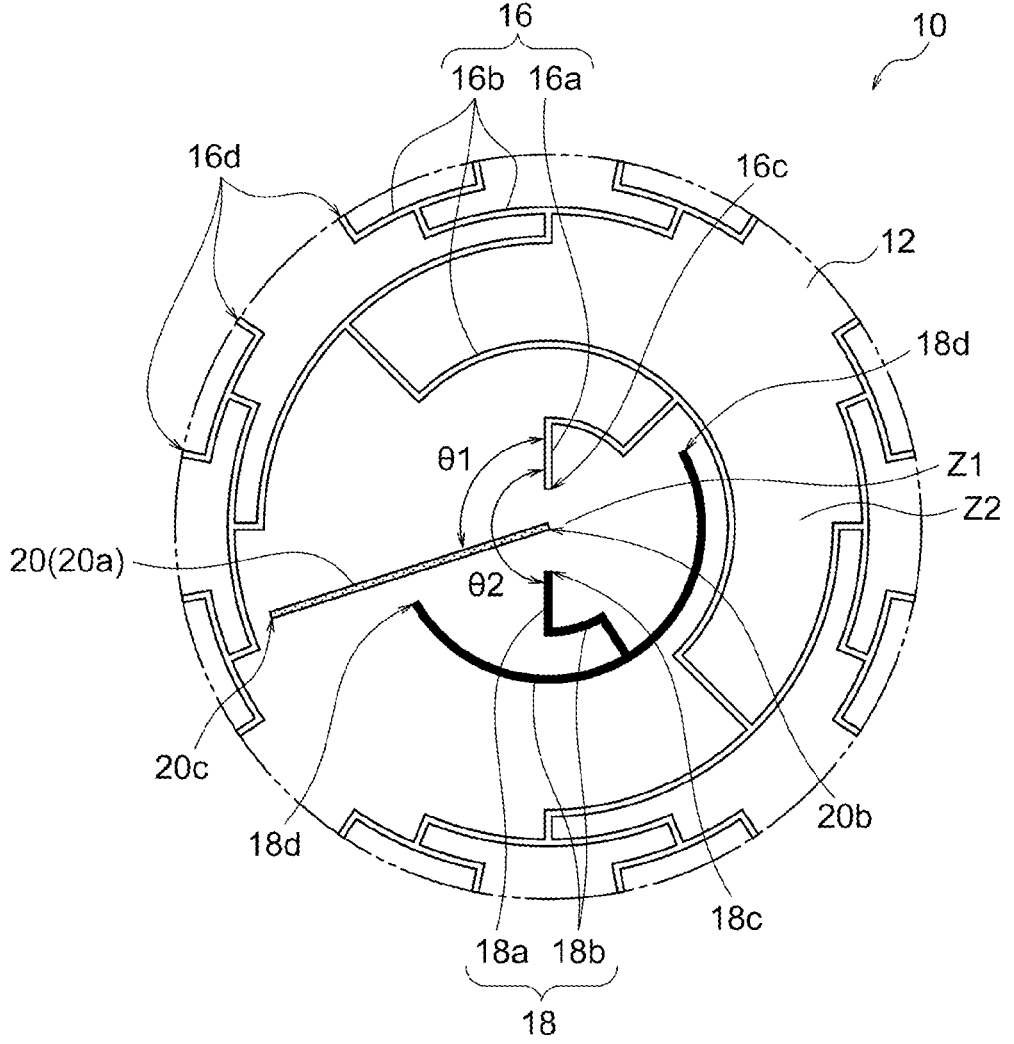
FIG. 4 is a perspective plan view showing a modification of the arrangement of the purge gas groove, the vacuum suction groove, and the thermocouple insertion groove in the ceramic susceptor according to the present invention.
Figure 5:
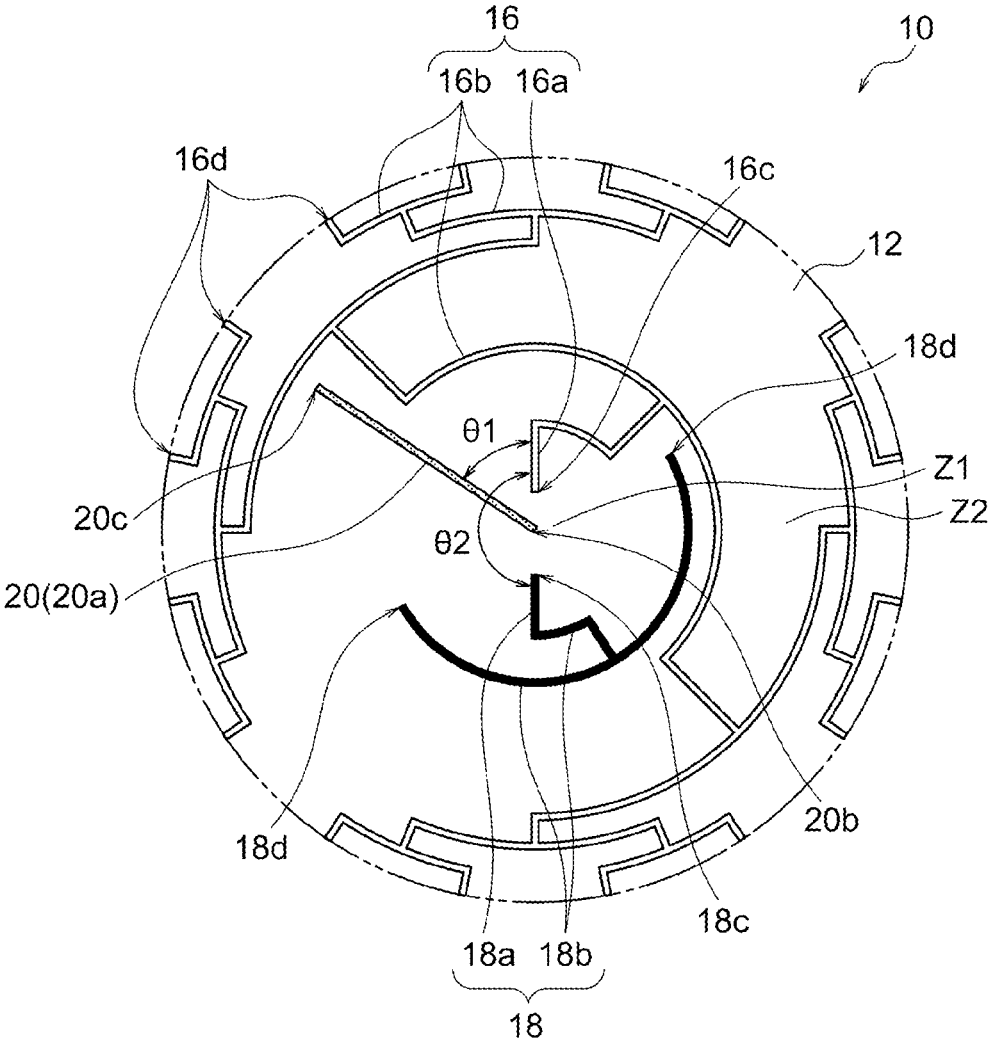
FIG. 5 is a perspective plan view showing another modification of the arrangement of the purge gas groove, the vacuum suction groove, and the thermocouple insertion groove in the ceramic susceptor according to the present invention.

From the aforementioned viewpoint, the angle $\theta_1$-formed by the straight-line portion 16a of the purge gas groove 16 and the straight-line portion 20a of the thermocouple inser-tion groove 20 satisfies $50° < \theta_1 < 180°$, preferably $70° < \theta_1 < 170°$, more preferably $80° < \theta_1 < 160°$, even more preferably $90° < \theta_1 < 150°$, and especially preferably $100° < \theta_1 < 140°$. From a similar viewpoint, the angle $\theta_2$ formed by the straight-line portion 16a of the purge gas groove 16 and the straight-line portion 18a of the vacuum suction groove 18 satisfies $135° < \theta_2 < 310°$, preferably $145° < \theta_2 < 225°$, more preferably $155° < \theta_2 < 205°$, even more preferably $165° < \theta_2 < 195°$, and especially preferably $175° < \theta_2 < 185°$. FIGS. 4 and 5 show a modification of the arrangement of the purge gas groove 16, the vacuum suction groove 18, and the thermocouple insertion groove 20. As is understandable from FIGS. 1, 4 and 5, when the angles $\theta_1$ and $\theta_2$ are respectively regarded as rotation angles by which the straight-line portion 16a of the purge gas groove 16 is rotated with respect to a center axis of the ceramic plate bonded body 12, the angle $\theta_2$ is defined as a rotation angle (that is, an angle including the entire angle $\theta_1$) when the straight-line portion 16a is rotated in a same rotation direc-tion as the angle $\theta_1$. Accordingly, the relationship between $\theta_1$ and $\theta_2$ satisfies $\theta_1 < \theta_2$, preferably $1.1\theta_1 < \theta_2$, and more preferably $1.2\theta_1 < \theta_2$. Accordingly, $\theta_2$ is determined to include $\theta_1$.

The ceramic plate bonded body 12 includes the upper ceramic plate 12a and the lower ceramic plate 12b that are bonded to each other on the bonding surface 12c. The upper ceramic plate 12a and the lower ceramic plate 12b may be made of materials having same physical properties or may be made of materials having different physical properties (for example, volume resistance and coefficient of thermal expansion) from each other. In the case of the latter, for example, the volume resistance of the upper ceramic plate 12a may be made relatively higher than the volume resis-tance of the lower ceramic plate 12b, or the volume resis-tance of the lower ceramic plate 12b may be made relatively higher than the volume resistance of the upper ceramic plate 12a. In any case, each of the upper ceramic plate 12a and the lower ceramic plate 12b is not particularly limited except for the configurations of the purge gas flow path, the vacuum suction path, and the thermocouple insertion path, and may have a similar configuration to that of a ceramic plate employed in a known ceramic susceptor or ceramic heater. Accordingly, the upper ceramic plate 12a and the lower ceramic plate 12b preferably include aluminum nitride or aluminum oxide, and more preferably include aluminum nitride, from viewpoints of excellent thermal conductivity, high electrical insulation, and thermal expansion properties close to those of silicon.

The ceramic plate bonded body 12 has the central zone Z1 defined as the circular region where the ceramic shaft 22 is to be concentrically disposed, and the outer peripheral zone Z2 outside the central zone Z1, when seen in plan view. Accordingly, the circular region corresponding to the central zone Z1 is identified as the region corresponding to the region surrounded by an outer circumferential circle of the ceramic shaft 22, when the ceramic shaft 22 is attached to the ceramic plate bonded body 12.

The internal electrode 14 is an electrode to be embedded in the ceramic plate bonded body 12, and includes at least one selected from the group consisting of a heater electrode, an RF electrode and an ESC electrode. The heater electrode is not particularly limited, but may be, for example, a conductive coil wired in a single stroke manner over an entire surface of the upper ceramic plate 12a. Terminal rods 24 are connected to both ends of the heater electrode to feed power, and the terminal rods 24 are connected to a heater power source (not illustrated) (via a cable 26 as desired). The heater electrode generates heat when supplied with power from the heater power source and heats a wafer placed on the top surface of the first surface 12d. The heater electrode is not limited to the coil, but may be, for example, a ribbon (long thin plate), mesh, or printing. The RF electrode enables film formation by plasma CVD process by applying high frequency. An ESC electrode is an abbreviation of an electrostatic chuck (ESC) electrode and is also referred to as an electrostatic electrode. The ESC electrode is preferably a circular thin layer electrode having a diameter slightly smaller than that of the ceramic plate bonded body 12, and may be, for example, an electrode having a mesh shape made of thin metal wires woven into a mesh shape to be formed into a sheet shape. The ESC electrode may be used as a plasma electrode. In other words, by applying high frequency to the ESC electrode, the ESC electrode can also be used as the RF electrode, and film formation by plasma CVD process can also be performed. The terminal rods 24 for feeding power are connected to the ESC electrode, and the terminal rods 24 are connected to the external power source (not illustrated) (via the cable 26 as desired). When a voltage is applied to the ESC electrode by the external power source, the ESC electrode chucks the wafer placed on the top surface of the ceramic plate bonded body 12 by Johnson-Rahbek forces. The internal electrode 14 preferably includes a heater electrode 14a, and an RF or ESC electrode 14b. Further, the internal electrode 14 is typically embedded in the upper ceramic plate 12a as shown in FIG. 3, but the internal electrode 14 may also be embedded in the lower ceramic plate 12b.

As desired, the ceramic shaft 22 may be concentrically attached to the central zone Z1 in the second surface 12e of the ceramic plate bonded body 12. The ceramic shaft 22 is a cylindrical member including an internal space S and may have a configuration similar to a ceramic shaft employed in a known ceramic susceptor or ceramic heater. The internal space S is formed so that the terminal rods 24 and/or the cables 26 pass therein. The ceramic shaft 22 is preferably formed of a ceramic material similar to the ceramic plate bonded body 12. Accordingly, the ceramic shaft 22 preferably includes aluminum nitride or aluminum oxide, and more preferably includes aluminum nitride. An upper end surface of the ceramic shaft 22 is preferably bonded to the second surface 12e of the ceramic plate bonded body 12 by solid-phase bonding or diffusion bonding. An outside diameter of the ceramic shaft 22 is not particularly limited, and is, for example, approximately 40 mm. An inside diameter (diameter of the internal space S) of the ceramic shaft 22 is not particularly limited either, and is, for example, approximately 36 mm.

The purge gas groove 16 is a groove forming the purge gas flow path with the bonding surface 12c and is provided on the bonding surface 12c side of the upper ceramic plate 12a or the lower ceramic plate 12b. Due to the presence of the purge gas groove 16 or the purge gas flow path, it is possible to eject inert purge gas to an outer peripheral portion of the ceramic plate bonded body 12 (first surface 12d, in particular), and prevent the process gas from flowing to the back surface of the wafer (not illustrated) placed on the first surface 12d. Accordingly, it is possible to prevent the process gas from entering the back surface of the wafer placed on the first surface 12d and creating deposits during the manufacturing process of the semiconductor device. The purge gas groove 16 is preferably provided in the upper ceramic plate 12a as shown in FIG. 3, but may be provided in the lower ceramic plate 12b.

The purge gas groove 16 has the straight-line portion 16a that is arranged in a straight line toward the outer peripheral zone Z2 from the purge gas inlet 16c in the central zone Z1, and the extended portion 16b extending in the outer peripheral zone Z2 from the straight-line portion 16a. The extended portion 16b extends in the outer peripheral zone Z2 from the straight-line portion 16a, to reach the plurality of purge gas outlets 16d disposed in the outer peripheral portion of the ceramic plate bonded body 12 through one or more selected from the group consisting of branching, bending, curving, and straight progression. In other words, the straight-line portion 16a has a suitable configuration to avoid crowding of the purge gas groove 16, the vacuum suction groove 18, and the thermocouple insertion groove 20 in the central zone Z1 and a vicinity thereof, whereas the extended portion 16b has a suitable configuration to reach the plurality of purge gas outlets 16d disposed in the outer peripheral portion of the ceramic plate bonded body 12 with path lengths as uniform as possible. From such a viewpoint, the extended portion 16b preferably includes all of branching, bending, curving, and straight progression. A number of components selected from the group consisting of branching, bending, curving, and straight progression in the extended portion 16b can be properly determined according to the number and arrangement of the purge gas outlets 16d, and is not particularly limited if it is one or more, but preferably two or more, more preferably three or more, even more preferably four or more, especially preferably five or more, and for example, 10 or more. The components selected from the group consisting of branching, bending, curving, and straight progression in the extended portion 16b can be properly combined so as to be able to reach the plurality of purge gas outlets 16d with the path lengths as uniform as possible without intersecting the vacuum suction groove 18 and the thermocouple insertion groove 20. Specifically, each of the path lengths of the purge gas groove 16 from the purge gas inlet 16c to the plurality of purge gas outlets 16d is preferably within ±10% of an average path length of the purge gas groove 16, and more preferably within ±8%. The path length of the purge gas groove 16 is a planar distance from the purge gas inlet 16c to the purge gas outlet 16d, and does not include a distance in a depth direction of a purge gas ejection port that may be provided to communicate with the purge gas outlet 16d, and a distance in a depth direction of the purge gas ejection port 30 that may be provided to communicate with the purge gas inlet 16c. In order to eject purge gas uniformly over the outer peripheral portion of the ceramic plate bonded body 12, the plurality of purge gas outlets 16d are preferably disposed at equal intervals along the outer peripheral portion of the ceramic plate bonded body 12. The number of purge gas outlets 16d is not particularly limited, but is typically four to 24, and for example, is 16 as shown in FIGS. 1 and 2.

When the ceramic susceptor 10 includes the ceramic shaft 22, it is preferable to provide a purge gas supply hole 28 that penetrates through the side wall forming the ceramic shaft 22 and the lower ceramic plate 12b to communicate with the purge gas inlet 16c. In doing so, the purge gas supply hole 28, the purge gas inlet 16c, the purge gas groove 16, and the purge gas outlets 16d entirely form the purge gas flow path.

The purge gas outlet 16d is an open end located opposite to the purge gas inlet 16c of the purge gas groove 16, and has a role of making it possible to eject inert purge gas to the outer peripheral portion of the ceramic plate bonded body 12. In this regard, in order to more effectively realize the function of preventing the process gas from entering the back surface of the wafer placed on the first surface 12d and creating deposits during the manufacturing process of a semiconductor device, it is preferable to provide a configuration in which the purge gas can be ejected from the outer peripheral portion of the first surface 12d of the ceramic plate bonded body 12. In other words, it is preferable to provide a purge gas ejection port 30 for ejecting the purge gas from the outer peripheral portion of the first surface 12d. For example, as shown in FIG. 3, it is preferable to adopt a configuration in which a purge ring 32 is annularly provided along an outer peripheral edge of the ceramic plate bonded body 12 and guides the purge gas discharged from the purge gas outlets 16d so that the purge gas is ejected from the outer peripheral portion of the first surface 12d. In this case, a gap between the outer peripheral edge of the ceramic plate bonded body 12 and the purge ring 32 may form the purge gas ejection port 30. Alternatively, the upper ceramic plate 12a may be configured to further include a vertical hole (not illustrated) communicating with the first surface 12d from the purge gas outlet 16d, and in this case, the vertical hole may form the purge gas ejection port 30 that allows the purge gas to be ejected from the outer peripheral portion of the first surface 12d.

The vacuum suction groove 18 is a groove forming the vacuum suction path with the bonding surface 12c, and is provided on the bonding surface 12c side of the upper ceramic plate 12a or the lower ceramic plate 12b without intersecting the purge gas groove 16. Due to the presence of the vacuum suction groove 18 or the vacuum suction path, it is possible to suck and fix the wafer (not illustrated) placed on the first surface 12*d* of the ceramic plate bonded body 12 to the first surface 12*d* by vacuum suction during the manufacturing process of a semiconductor device. In other words, it is possible to prevent the wafer placed on the first surface 12*d* from moving during the manufacturing process of the semiconductor device. The vacuum suction groove 18 is preferably provided in the lower ceramic plate 12*b* as shown in FIG. 3 but may be provided in the upper ceramic plate 12*a*.

The vacuum suction groove 18 has the straight-line portion 18*a* arranged in a straight line toward the outer peripheral zone Z2 from the vacuum suction inlet 18*c* in the central zone Z1, and the extended portion 18*b* extending in the outer peripheral zone Z2 from the straight-line portion 18*a*. The extended portion 18*b* extends in the outer peripheral zone Z2 from the straight-line portion 18*a* to reach the plurality of vacuum suction outlets 18*d* of ceramic plate bonded body 12 through one or more selected from the group consisting of branching, bending, curving, and straight progression. In other words, the straight-line portion 18*a* has a configuration suitable to avoid crowding of the purge gas groove 16, the vacuum suction groove 18, and the thermocouple insertion groove 20 in the central zone Z1 and the vicinity thereof, whereas the extended portion 18*b* has a configuration suitable to reach the plurality of vacuum suction outlets 18*d* disposed in the outer peripheral zone Z2 with path length as uniform as possible.

From such a viewpoint, the extended portion 18*b* preferably includes all of branching, bending, curving, and straight progression. The number of components selected from the group consisting of branching, bending, curving, and straight progression in the extended portion 18*b* can be properly determined according to the number and arrangement of the vacuum suction outlets 18*d*, and is not particularly limited as long as it is one or more, but is preferably two or more, more preferably three or more, even more preferably four or more, especially preferably five or more, and for example, six or more. Components selected from the group consisting of branching, bending, curving, and straight progression in the extended portion 18*b* can be properly combined so as to be able to reach the plurality of the vacuum suction outlets 18*d* with the path lengths as uniform as possible without intersecting the purge gas groove 16 and the thermocouple insertion groove 20. Specifically, respective path lengths of the vacuum suction groove 18 from the vacuum suction inlet 18*c* to the plurality of vacuum suction outlets 18*d* are preferably within ±10% of an average path length of the vacuum suction groove 18, and more preferably within ±8%. The path length of the vacuum suction groove 18 is a planar distance from the vacuum suction inlet 18*c* to the vacuum suction outlet 18*d*, and does not include a distance in a depth direction of the vacuum suction outlet 18*d* and a distance in a depth length of a vacuum suction hole 34 that can be provided to communicate with the vacuum suction inlet 18*c*.

In order to suck and fix a wafer to the first surface 12*d* as uniformly as possible, the plurality of vacuum suction outlets 18*d* are preferably disposed rotationally symmetrically about the center axis of the ceramic plate bonded body 12. The number of vacuum suction outlets 18*d* is not particularly limited if it is two or more, but is typically two to six, and for example, two as shown in FIGS. 1 and 2.

When the ceramic susceptor 10 includes the ceramic shaft 22, it is preferable to provide the vacuum suction hole 34 that penetrates through the side wall forming the ceramic shaft 22 and the lower ceramic plate 12*b* to communicate with the vacuum suction inlet 18*c*. In doing so, the vacuum suction hole 34, the vacuum suction inlet 18*c*, the vacuum suction groove 18, and the vacuum suction outlets 18*d* entirely constitute the vacuum suction path. A vacuum pump (not illustrated) may be connected to a distal end of the vacuum suction hole 34.

The thermocouple insertion groove 20 is a groove forming the thermocouple insertion path with the bonding surface 12*c* and is provided on the bonding surface 12*c* side of the upper ceramic plate 12*a* or the lower ceramic plate without intersecting the purge gas flow path and the vacuum suction path. Due to the presence of the thermocouple insertion groove 20 or the thermocouple insertion path, it is possible to insert or accommodate a thermocouple 36 therein, and measure temperature of the ceramic plate bonded body 12 or the internal electrode 14 in the outer peripheral zone Z2. The thermocouple insertion groove 20 is preferably provided in the lower ceramic plate 12*b* as shown in FIG. 3 but may be provided in the upper ceramic plate 12*a*.

The thermocouple insertion groove 20 has the straight-line portion 20*a* arranged in a straight line toward the thermocouple insertion path end 20*c* located in the outer peripheral zone Z2 from the thermocouple insertion port 20*b* in the central zone Z1. In other words, the straight-line portion 20*a* can be said as not only having a shape in which the thermocouple 36 is easily inserted, but also having a structure suitable to avoid crowding of the purge gas groove 16, the vacuum suction groove 18, and the thermocouple insertion groove 20 in the central zone Z1 and the vicinity thereof. The thermocouple insertion path end 20*c* is preferably a closed end for accurate temperature measurement.

In the internal space S of the ceramic shaft 22, a tubular thermocouple guide 38 for guiding insertion of the thermocouple 36 into the thermocouple insertion path is preferably provided in the second surface 12*e* of the ceramic plate bonded body 12 to communicate with the thermocouple insertion port 20*b*. According to this configuration, the thermocouple 36 can be smoothly inserted into the thermocouple insertion path. Accordingly, the ceramic susceptor 10 preferably further includes the thermocouple 36 inserted into the thermocouple insertion path through the thermocouple guide 38 and the thermocouple insertion port 20*b*. A temperature measuring instrument (not illustrated) may be connected to a distal end of the thermocouple 36.

A thermocouple insertion hole 40 may be preferably provided in the central zone Z1 of the ceramic plate bonded body 12 as a vertical hole that penetrates through the lower ceramic plate 12*b* from the second surface 12*e* to reach the upper ceramic plate 12*a*, separately from the thermocouple insertion groove 20 or the thermocouple insertion path described above. By inserting another thermocouple 36 into the thermocouple insertion hole 40, it is possible to measure the temperature of the ceramic plate bonded body 12 or the internal electrode 14 in the central zone Z1.

Figure 6:
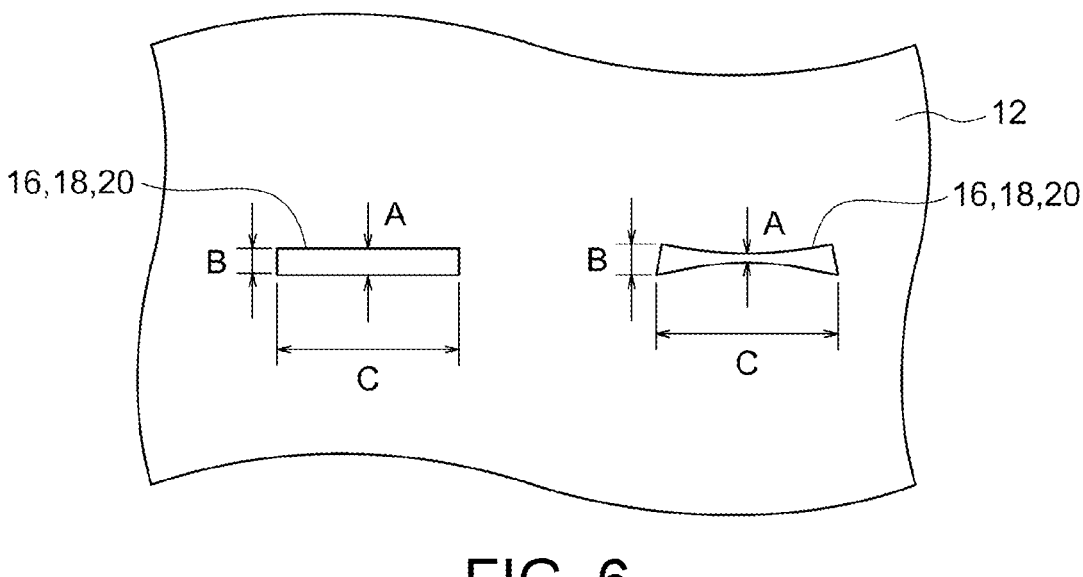
FIG. 6 is a schematic sectional view for describing various dimensions of the purge gas groove, the vacuum suction groove, and the thermocouple insertion groove.

When the respective grooves of the purge gas groove 16, the vacuum suction grove 18, and the thermocouple insertion groove 20 are seen in a section perpendicular to a longitudinal direction of the grooves as shown in FIG. 6, various dimensions of the grooves 16, 18, and 20 are as follows, and are respectively preferable from viewpoints of securing a gas flow rate, securing vacuum suction force, and smooth insertion of the thermocouple. In other words, heights A in central portions of the grooves 16, 18, and 20 are preferably from 0.1 to 3.0 mm. Heights B of end portions of the grooves 16, 18, and 20 are preferably from 0.5 to 3.0 mm. Widths C of the grooves 16, 18, and 20 are preferably from 2.0 to 10.0 mm. Further, as in the grooves 16, 18, and 20 shown on the right side of FIG. 6, the heights A of central portions of the grooves 16, 18, and 20 are preferably smaller than the heights B of end portions of the grooves 16, 18, and 20. Specifically, a ratio (B/A) of each of the heights B of the end portions of the grooves 16, 18, and 20 to each of the heights A of the central portions of the grooves 16, 18, and 20 is preferably from 0.2 to 1.0. Note that the above-described ratio of B/A is a value individually calculated with respect to each of the purge gas groove 16, the vacuum suction groove 18, and the thermocouple insertion groove 20 like the B/A ratio of the purge gas groove 16, the B/A ratio of the vacuum suction groove 18, and the B/A ratio of the thermocouple insertion groove 20, and should not be calculated based on B and A concerning the different types of grooves. Among the purge gas groove 16, the vacuum suction groove 18, and the thermocouple insertion groove 20, the heights A of the central portions may have a common value, or may have different values. Similarly, among the purge gas groove 16, the vacuum suction groove 18 and the thermocouple insertion groove 20, the heights B of the end portions may have a common value or may have different values, and the widths C may have a common value or may have different values.

The ceramic plate bonded body 12 or the ceramic susceptor 10 can be manufactured by using a known method except that the arrangement and specifications of the purge gas groove 16, the vacuum suction groove 18, and the thermocouple insertion groove 20 are made as mentioned above. For example, it is possible to manufacture the ceramic plate bonded body 12 by bonding the disk-shaped upper ceramic plate 12a in which the internal electrode 14 is embedded and at least one groove for internal path (for example, the purge gas groove 16) is formed, and the disk-shaped lower ceramic plate 12b in which the other grooves for internal paths (for example, the vacuum suction groove 18 and the thermocouple insertion groove 20) are formed to each other by applying a known ceramic bonding agent to the surfaces to be bonded (portions other than the grooves, on the surfaces in which the grooves are present) and thereafter, firing the upper and lower ceramic plates 12a and 12b as appropriate.

What is claimed is:

1. A ceramic susceptor, comprising:
a disk-shaped ceramic plate bonded body comprising an upper ceramic plate and a lower ceramic plate that are bonded to each other on a bonding surface, the disk-shaped ceramic plate bonded body having a first surface of the upper ceramic plate on an opposite side to the bonding surface and a second surface of the lower ceramic plate on an opposite side to the bonding surface;
at least one internal electrode selected from the group consisting of a heater electrode, an RF electrode, and an ESC electrode, and embedded in the disk-shaped ceramic plate bonded body;
a purge gas groove provided on a bonding surface side of the upper ceramic plate or the lower ceramic plate, and constituting a purge gas flow path with the bonding surface;
a vacuum suction groove provided on the bonding surface side of the upper ceramic plate or the lower ceramic plate without intersecting the purge gas groove, and constituting a vacuum suction path with the bonding surface; and
a thermocouple insertion groove provided on the bonding surface side of the upper ceramic plate or the lower ceramic plate without intersecting the purge gas flow path and the vacuum suction path, and constituting a thermocouple insertion path with the bonding surface,
wherein when seen in plan view, the disk-shaped ceramic plate bonded body has a central zone defined as a circular region in which a ceramic shaft is to be concentrically disposed, and an outer peripheral zone outside the central zone,
wherein the purge gas groove has a straight-line portion arranged in a straight line toward the outer peripheral zone from a purge gas inlet in the central zone, and an extended portion that extends in the outer peripheral zone from the straight-line portion to reach a plurality of purge gas outlets disposed in an outer peripheral portion of the disk-shaped ceramic plate bonded body through one or more selected from the group consisting of branching, bending, curving, and straight progression,
wherein the vacuum suction groove has a straight-line portion arranged in a straight line toward the outer peripheral zone from a vacuum suction inlet in the central zone, and an extended portion that extends in the outer peripheral zone from the straight-line portion to reach a plurality of vacuum suction outlets of the disk-shaped ceramic plate bonded body through one or more selected from the group consisting of branching, bending, curving, and straight progression,
wherein the thermocouple insertion groove has a straight-line portion that is arranged in a straight line toward a thermocouple insertion path end located in the outer peripheral zone from a thermocouple insertion port in the central zone, and
wherein an angle $\theta_1$ formed by the straight-line portion of the purge gas groove and the straight-line portion of the thermocouple insertion groove, and an angle $\theta_2$ formed by the straight-line portion of the purge gas groove and the straight-line portion of the vacuum suction groove satisfy the following relationship:

$$50° < \theta_1 < 180°,$$

$$135° < \theta_2 < 310°, \text{ and}$$

$$\theta_1 < \theta_2.$$

2. The ceramic susceptor according to claim 1, further comprising a cylindrical ceramic shaft concentrically attached to the central zone in the second surface of the disk-shaped ceramic plate bonded body.

3. The ceramic susceptor according to claim 2, comprising a purge gas supply hole that penetrates through a side wall constituting the ceramic shaft and the lower ceramic plate to communicate with the purge gas inlet, whereby the purge gas supply hole, the purge gas inlet, the purge gas groove, and the purge gas outlets entirely constitute the purge gas flow path.

4. The ceramic susceptor according to claim 2, comprising a vacuum suction hole that penetrates through a side wall constituting the ceramic shaft and the lower ceramic plate to communicate with the vacuum suction inlet, whereby the vacuum suction hole, the vacuum suction inlet, the vacuum suction groove, and the vacuum suction outlets entirely constitute the vacuum suction path.

5. The ceramic susceptor according to claim 1, wherein each of path lengths of the purge gas groove from the purge gas inlet to the plurality of purge gas outlets is within ±10% of an average path length of the purge gas groove.

6. The ceramic susceptor according to claim 1, wherein each of path lengths of the vacuum suction groove from the vacuum suction inlet to the plurality of the vacuum suction outlets is within ±10% of an average path length of the vacuum suction groove.

7. The ceramic susceptor according to claim 1, wherein the plurality of purge gas outlets are disposed at equal intervals along the outer peripheral portion of the disk-shaped ceramic plate bonded body.

8. The ceramic susceptor according to claim 1, further comprising a purge ring annularly provided along an outer peripheral edge of the disk-shaped ceramic plate bonded body to guide purge gas discharged from the purge gas outlets so that the purge gas is ejected from an outer peripheral portion of the first surface, wherein a gap between the outer peripheral edge of the disk-shaped ceramic plate bonded body and the purge ring constitutes a purge gas ejection port.

9. The ceramic susceptor according to claim 1, wherein the upper ceramic plate further includes a vertical hole communicating with the first surface from the purge gas outlet, and the vertical hole constitutes a purge gas ejection port that allows purge gas to be ejected from an outer peripheral portion of the first surface.

10. The ceramic susceptor according to claim 1, wherein the plurality of vacuum suction outlets are disposed rotationally symmetrically with respect to a center axis of the disk-shaped ceramic plate bonded body.

11. The ceramic susceptor according to claim 1, further comprising a tubular thermocouple guide that is provided in the second surface of the disk-shaped ceramic plate bonded body to communicate with the thermocouple insertion port in an internal space of the ceramic shaft to guide insertion of a thermocouple into the thermocouple insertion path.

12. The ceramic susceptor according to claim 11, further comprising a thermocouple inserted into the thermocouple insertion path through the thermocouple guide and the thermocouple insertion port.

13. The ceramic susceptor according to claim 1,
wherein when each of the grooves of the purge gas groove, the vacuum suction groove, and the thermo-couple insertion groove is seen in a section perpen-dicular to a longitudinal direction of the groove,
a height of a central portion of the groove is from 0.1 to 3.0 mm,
a height of an end portion of the groove is from 0.5 to 3.0 mm,
a width of the groove is from 2.0 to 10.0 mm, and
a ratio of the height of the end portion of the groove to the height of the central portion of the groove is from 0.2 to 1.0.

*    *    *    *    *